United States Patent
Schultz et al.

(10) Patent No.: US 7,710,045 B2
(45) Date of Patent: May 4, 2010

(54) ILLUMINATION ASSEMBLY WITH ENHANCED THERMAL CONDUCTIVITY

(75) Inventors: John C. Schultz, Afton, MN (US); Nelson B. O'Bryan, Woodbury, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 285 days.

(21) Appl. No.: 11/276,901

(22) Filed: Mar. 17, 2006

(65) Prior Publication Data

US 2007/0216274 A1    Sep. 20, 2007

(51) Int. Cl.
H05B 41/16    (2006.01)

(52) U.S. Cl. .................... 315/246; 313/504; 313/46; 431/122

(58) Field of Classification Search .................... 257/40, 257/86, 94, 717, 720; 313/11, 12, 45, 108, 313/503–506, 509–512; 315/246; 361/688, 361/704–708; 438/122
See application file for complete search history.

(56) References Cited

U.S. PATENT DOCUMENTS

| | | | | |
|---|---|---|---|---|
| 3,346,757 | A | * | 10/1967 | Dierssen .................... 313/509 |
| 4,020,389 | A | * | 4/1977 | Dickson et al. ............. 315/246 |
| 4,782,893 | A | * | 11/1988 | Thomas .................... 165/185 |
| 5,781,412 | A | * | 7/1998 | de Sorgo .................... 361/704 |
| 5,873,161 | A | | 2/1999 | Chen et al. |
| 6,045,240 | A | | 4/2000 | Hochstein |
| 6,063,647 | A | | 5/2000 | Chen et al. |
| 6,246,010 | B1 | | 6/2001 | Zenner et al. |
| 6,265,820 | B1 | * | 7/2001 | Ghosh et al. ................ 313/483 |
| 6,274,224 | B1 | | 8/2001 | O'Bryan et al. |
| 6,577,492 | B2 | | 6/2003 | O'Bryan, Jr. |
| 6,638,378 | B2 | | 10/2003 | O'Bryan et al. |
| 6,649,325 | B1 | | 11/2003 | Gundale et al. |
| 6,657,297 | B1 | | 12/2003 | Jewram et al. |
| 6,799,902 | B2 | | 10/2004 | Anderson et al. |
| 6,847,114 | B2 | * | 1/2005 | Sett et al. .................... 257/717 |
| 6,867,539 | B1 | * | 3/2005 | McCormick et al. ........ 313/504 |
| 6,936,855 | B1 | | 8/2005 | Harrah |
| 2001/0001207 | A1 | | 5/2001 | Shimizu et al. |
| 2002/0113244 | A1 | | 8/2002 | Barnett et al. |

(Continued)

FOREIGN PATENT DOCUMENTS

EP    0751569    1/1997

(Continued)

OTHER PUBLICATIONS

Peiffer et al., "Electrical Performance Advantages of Ultra-Thin Dielectric Materials Used for Power-Ground Cores in High Speed, Multilayer Printed Circuit Boards", 13 pages, Presented at IPC Expo 2003.

(Continued)

*Primary Examiner*—Nimeshkumar D. Patel
*Assistant Examiner*—Mary Ellen Bowman

(57) ABSTRACT

Illumination assemblies include a substrate having a first and second electrically conductive layer separated by an electrically insulating layer. The insulating layer includes a polymer material loaded with thermally conductive particles. At least a portion of the thermally conductive particles simultaneously contact both the first and second electrically conductive layers. A plurality of light sources such as LEDs or other miniature light sources are preferably disposed on the first conductive layer.

18 Claims, 6 Drawing Sheets

U.S. PATENT DOCUMENTS

| | | |
|---|---|---|
| 2003/0001488 A1 | 1/2003 | Sundahl |
| 2003/0063465 A1 | 4/2003 | McMillan et al. |
| 2003/0178627 A1 | 9/2003 | Marchl et al. |
| 2005/0077839 A1 | 4/2005 | Ho |
| 2005/0116235 A1 | 6/2005 | Schultz et al. |
| 2005/0265029 A1 | 12/2005 | Epstein et al. |
| 2006/0012991 A1 | 1/2006 | Weaver, Jr. et al. |
| 2006/0098438 A1 | 5/2006 | Ouderkirk et al. |

FOREIGN PATENT DOCUMENTS

| | | |
|---|---|---|
| EP | 0790762 | 8/1997 |
| EP | 1795514 | 6/2007 |
| FR | 2 662 896 | 6/1991 |
| WO | WO 2005/029185 | 3/2005 |

OTHER PUBLICATIONS

Peiffer, Joel S., "Embedded Capacitor Material Evaluation", pp. 1-4, Presented at IPC SMEMA Council APEX$^{SM}$, 2001.

Peiffer, Joel S., "Ultra-Thin, Loaded Epoxy Materials for Use as Embedded Capacitor Layers; Use of <25 μm high capacitance power-ground cores can eliminate hundreds of discrete capacitors, not to mention improving signal integrity and EMI.", Printed Circuit Design & Manufacture, pp. 40-42, Apr. 2004.

Peiffer, Joel S., "The History of Embedded Distributed Capacitance; Embedded distributed capacitance is much older that most thin, with the first known U.S. patents being issued in the 1920's. A look at six important—yet overlooked—works.", pp. 32-37, Printed Circuit Design & Manufacture, Aug. 2004.

U.S. Application entitled "LED Illumination Assembly with Compliant Foil Construction", filed Jan. 31, 2006, having U.S. Appl. No. 60/743,195.

Xu et al., "Power-Bus Decoupling With Embedded Capacitance in Printed Circuit Board Design", pp. 22-30, IEEE Transactions on Electromagnetic Compatibility, vol. 45, No. 1, Feb. 2003.

* cited by examiner

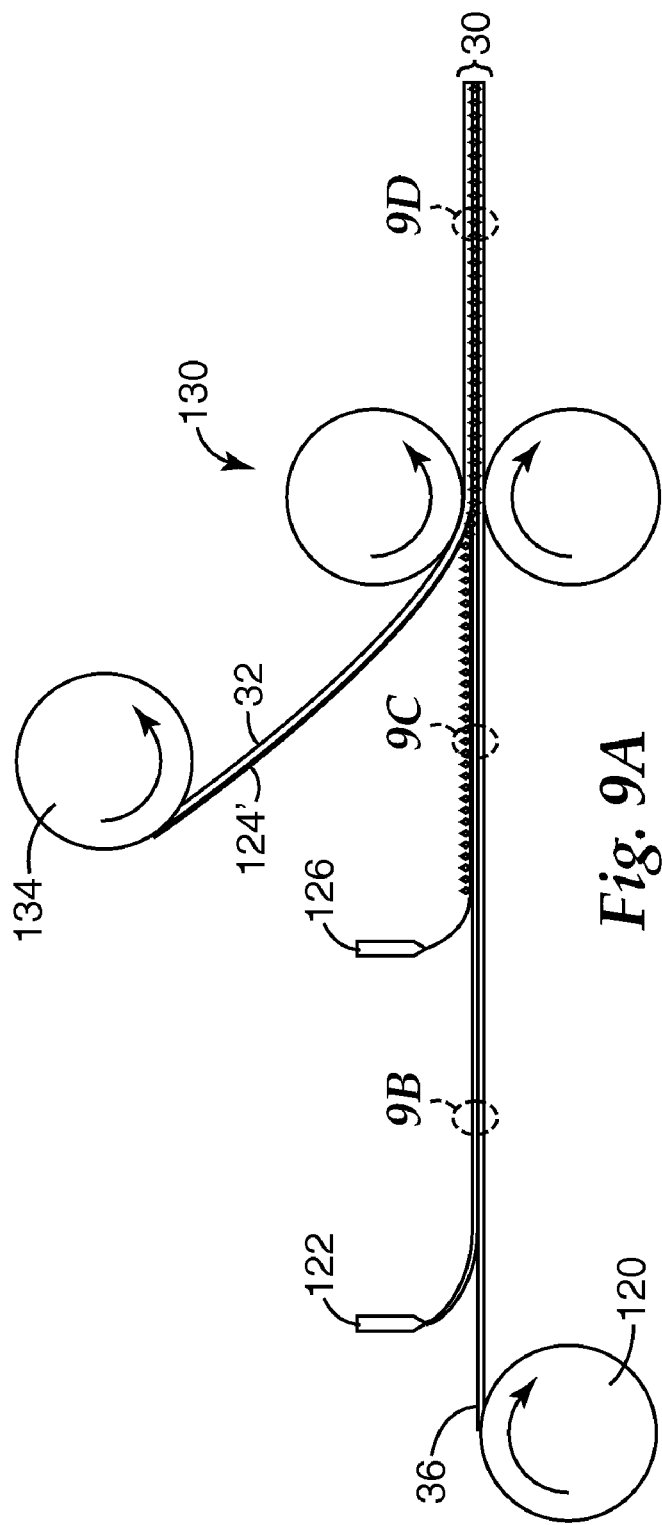

ILLUMINATION ASSEMBLY WITH ENHANCED THERMAL CONDUCTIVITY

FIELD OF THE INVENTION

The present invention relates to electronic devices that generate substantial heat, and specifically light sources such as light emitting diode (LED) devices and their use with liquid crystal display (LCD) devices, components thereof, and related articles and processes.

BACKGROUND

LEDs are a desirable choice of light source in part because of their relatively small size, low power/current requirements, rapid response time, long life, robust packaging, variety of available output wavelengths, and compatibility with modern circuit construction. These characteristics may help explain their widespread use over the past few decades in a multitude of different end use applications. Improvements to LEDs continue to be made in the areas of efficiency, brightness, and output wavelength, further enlarging the scope of potential end-use applications.

Recently, LEDs have begun to be used in illumination units for backlighting purposes in LCD television devices, as well as other types of lighting, signage, and display systems. For most lighting applications, it is necessary to have a plurality of LEDs to supply the required light intensity. Because of their relatively small size, a plurality of LEDs can be assembled in arrays having small dimensions and a high luminance or irradiance particularly if unpackaged or bare die LEDs are used.

It is possible to achieve an increase in the light density of an array of LEDs by increasing the packing density of the individual LEDs within the array. An increase in packing density can be achieved by increasing the number of LEDs within the array without increasing the space occupied by the array, or by maintaining the number of LEDs within the array and decreasing the array dimensions. However, tightly packing large numbers of LEDs in an array is a long term reliability concern since local heating, even with a globally efficient thermal conduction mechanism, can reduce the lifespan of the LEDs. Therefore, dissipating the heat generated by the array of LEDs becomes more important as the packing density of the LEDs increases.

In other applications, even those without high packing densities, the driving voltages/currents, size and brightness of LED dies are increasing, leading to increases in local temperatures around the LED dies. Consequently, there is a need for better heat dissipation at the location of each LED die, as well as across the array.

Conventional LED mounting techniques use packages like that illustrated in U.S. Patent Application Publication 2001/0001207A1 (Shimizu et al.), that are unable to quickly transport the heat generated in the LED away from the LED. As a consequence, performance of the device is limited. More recently, thermally enhanced packages have become available, in which LEDs are mounted and wired on electrically insulating but thermally conductive substrates such as ceramics, or with arrays of thermally conductive vias (e.g., U.S. Patent Application Publication 2003/0001488A1 (Sundahl)), or use a lead frame to electrically contact a die attached to a thermally conductive and electrically conductive thermal transport medium (e.g., U.S. Patent Application Publication 2002/0113244A1 (Barnett et al.)). An illumination assembly having improved thermal properties is disclosed in U.S. Patent Application Publication 2005/0116235A1 (Schultz et al.), in which an illumination assembly includes a plurality of LED dies disposed on a substrate having an electrically insulative layer on a first side of the substrate and an electrically conductive layer on a second side of the substrate. Each LED die is disposed in a via extending through the electrically insulative layer on the first side of the substrate to the electrically conductive layer on the second side of the substrate, and each LED die is thermally and electrically connected through the via to the electrically conductive layer. The electrically conductive layer is patterned to define a plurality of electrically isolated heat spreading elements which are in turn disposed adjacent a heat dissipation assembly.

Although the more recent approaches improve the thermal properties of LED arrays, there remains a continuing need for improved thermal properties, lower cost and simpler fabrication processes.

BRIEF SUMMARY

The present application discloses, inter alia, illumination assemblies that include a substrate having a first and second electrically conductive layer separated by an electrically insulating layer. The insulating layer includes a polymer material loaded with thermally conductive particles. At least a portion of the thermally conductive particles simultaneously contact both the first and second electrically conductive layers. A plurality of light sources are preferably disposed on the first conductive layer. The thermally conductive particles produce a lower thermal impedance than an electrically insulating layer loaded with particles substantially smaller than the insulating layer thickness.

In exemplary embodiments, the thermally conductive particles are distributed near the LED dies. In some embodiments, the first and second electrically conductive foils and the electrically insulating layer are altered to control the optical properties of the substrate. The insulating layer may also include the same polymer material loaded with particles with a high relative dielectric constant that are in electrical contact with both electrically conducting layers. At least a portion of the dielectric particles simultaneously contact both the first and second electrically conductive layers producing a higher effective dielectric constant than could be obtained by loading the dielectric layer with particles substantially smaller than the dielectric layer thickness.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF THE DRAWINGS

FIGS. 9A-9D are schematic illustrations of one method of making a substrate with enhanced thermal conductivity.

In the Figures, like reference numerals designate like elements. The Figures are idealized, not drawn to scale, and intended for illustrative purposes only.

DETAILED DESCRIPTION OF ILLUSTRATIVE EMBODIMENTS

The following Description describes an illumination assembly including LED dies. In this regard, "light emitting diode" or "LED" refers to a diode that emits light, whether visible, ultraviolet, or infrared. It includes incoherent encased or encapsulated semiconductor devices marketed as "LEDs", whether of the conventional or super radiant variety, and whether of the forward-emitting or side-emitting variety, the latter of which is often advantageous in display applications. If the LED emits non-visible light such as ultraviolet light, and in some cases where it emits visible light, it can be packaged to include an organic or inorganic phosphor (or it may illuminate a remotely disposed phosphor) to convert short wavelength light to longer wavelength visible light, in some cases yielding a device that emits white light. An "LED die" is an LED in its most basic form, i.e., in the form of an individual component or chip made by semiconductor processing procedures. For example, the LED die is ordinarily formed from a combination of one or more Group III elements and of one or more Group V elements (III-V semiconductor). Examples of suitable III-V semiconductor materials include nitrides, such as gallium nitride, and phosphides, such as indium gallium phosphide. Other types of III-V materials can be used also, as might inorganic materials from other groups of the periodic table. The component or chip can include electrical contacts suitable for application of power to energize the device. Examples include solder reflow, wire bonding, tape automated bonding (TAB), or flip-chip bonding. The individual layers and other functional elements of the component or chip are typically formed on the wafer scale, and the finished wafer can then be diced into individual piece parts to yield a multiplicity of LED dies. The LED die may be configured for surface mount, chip-on-board, or other known mounting configurations. Some packaged LEDs are made by forming a polymer encapsulant formed over an LED die and an associated reflector cup.

Figure 1:
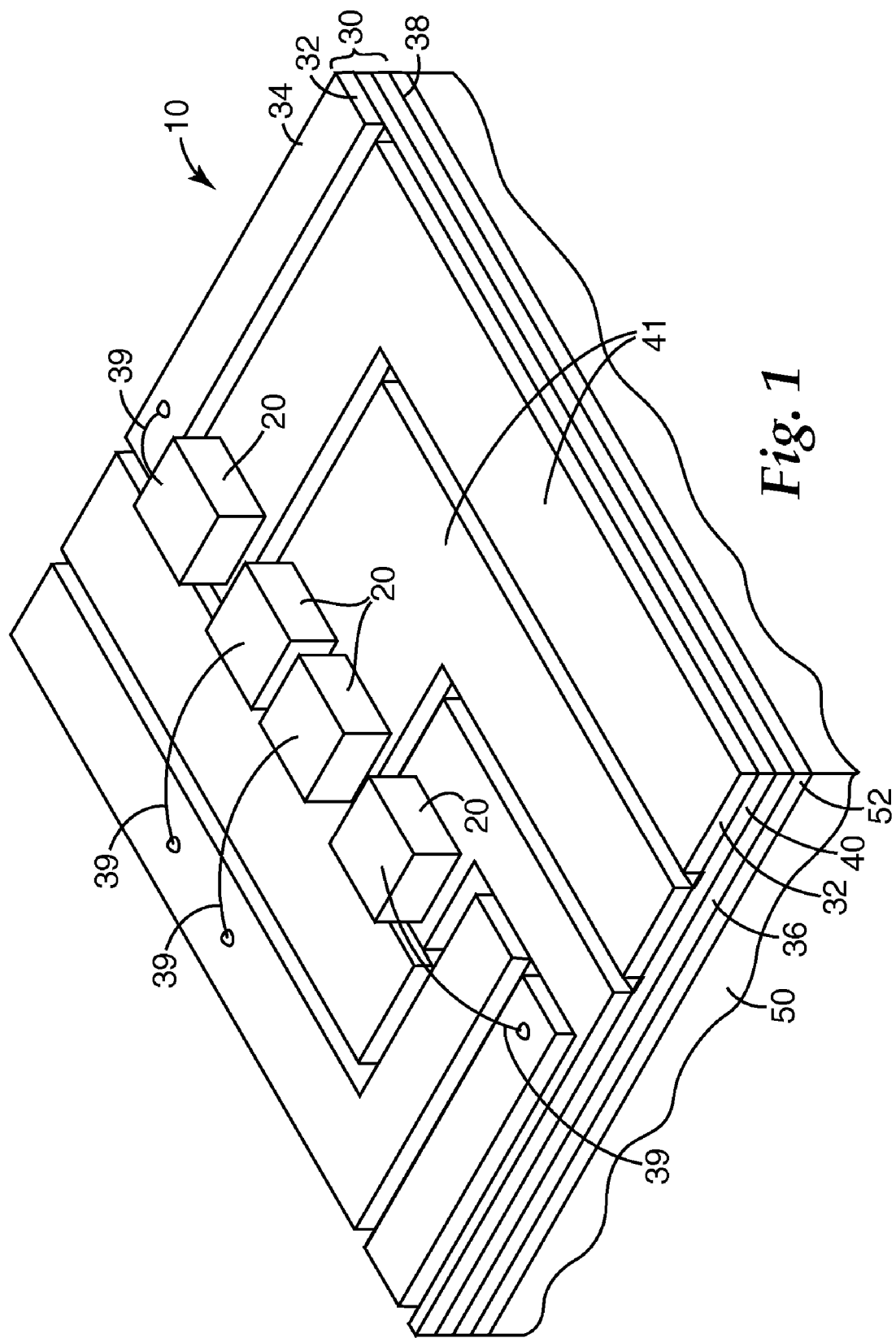
FIG. 1 is a perspective illustration of a portion of an illumination assembly.

Turning now to FIG. 1, a perspective view of a portion of an illumination assembly 10 is illustrated. The illumination assembly 10 includes a plurality of LED dies 20 disposed in an array on a substrate 30. LED dies 20 can be selected to emit a preferred wavelength, such as in the red, green, blue, ultraviolet or infrared spectral regions. LED dies 20 can each emit in the same spectral region, or in different spectral regions. In some cases, LED dies 20 are nominally 250 µm tall.

Substrate 30 includes a first electrically conductive layer 32 defining a top surface 34 of the substrate, and a second electrically conductive layer 36 defining a bottom surface 38 of the substrate 30. First and second electrically conductive layers 32, 36 are separated by an electrically insulating layer 40 having enhanced thermal conductivity provided by electrically insulating, thermally conductive particles 42 (illustrated in FIGS. 3-7). As illustrated, first electrically conductive layer 32 is patterned to form electrical circuit traces 41, and LED dies 20 are disposed on and electrically connected to first conductive layer 32. The illustrated circuit traces 41 are exemplary only.

In the illumination assembly 10 of FIG. 1, LED dies 20 are of the type having electrical contacts on opposed sides of the LED die, referred to as the base and top surface of the die. The contact on the base of each LED die 20 is electrically and thermally connected to a circuit trace 41 immediately beneath the LED die 20. The contact on the top of each LED die 20 is electrically connected to another portion of circuit trace 41 by a wirebond 39 extending from LED die 20. To facilitate good wirebonding, first conductive layer 32 can include a surface metallization of nickel and gold, for example.

First and second electrically conductive layers 32, 36 comprise an electrically conductive material, such as a metal or conductive plastic, e.g., a polymer loaded with conductive material such as silver flakes. In exemplary embodiments, first and second electrically conductive layers 32, 36 comprise or consist essentially of a metal foil. Suitable metals include copper, aluminum, nickel, gold, silver, palladium, tin, lead, and combinations thereof, for example aluminum clad copper foil. When first and second electrically conductive layers 32, 36 are metal, the metal preferably has an anneal temperature which is at or below the temperature for curing the polymer material of electrically insulating layer 40, or the metal is annealed before electrically insulating layer 40 is coated.

In some embodiments, the material of first conductive layer 32 is selected to provide the desired optical properties (e.g., reflectance, color, scattering, diffraction, or a combination of these properties) for the particular application. In other embodiments, the optical properties of top surface 34 of first conductive layer 32 are enhanced by plating and/or coating to provide the desired optical properties. In some embodiments, top surface 34 is plated, and then the exposed surface of the plating is coated to improve the optical performance. Suitable coating and plating materials include silver, passivated silver, gold, rhodium, aluminum, enhanced reflectivity aluminum, copper, indium, nickel (e.g., immersion, electroless or electroplated nickel), chromium, tin, and alloys thereof. In some embodiments, a coating may comprise a white coating such as a highly reflective white polymer, e.g., Starbrite EF reflective coatings sold by Spraylat Corporation, Pelham, N.Y. Multilayer dielectric stacks can also be deposited on surface 34 of first electrically conductive layer 32 for enhanced reflectivity. Suitable coatings may also include metal and semiconductor oxides, carbides, nitrides, as well as mixtures and compounds thereof. These coatings may be electrically conductive or insulating depending upon the intended application. Suitable coating methods include sputtering, physical vapor deposition, and chemical vapor deposition. The coating process may optionally be ion assisted. The optical properties of conductive layer 32 and platings or coatings thereon can also be modified by controlling the surface texture of surface 34 and/or the platings and coatings described previously. For example an optically smooth surface finish may be preferred in some cases, a matte or somewhat roughened surface finish in other cases. In other embodiments, optical films, such as Vikuiti™ Enhanced Specular Reflectivity (ESR) film sold by 3M Company, may also be applied to one or both major surfaces of first electrically conductive layer 32 to increase desirable optical properties, e.g., specular or diffuse reflectivity.

Typically, first and second electrically conductive layers 32, 36 have a thickness ranging from 0.5 to 8 mils (approximately 10 to 200 μm), more preferably 0.5 to 1.5 mils (approximately 10 to 38 μm). In some cases, it is desirable for first and second electrically conductive layers 32, 36 to each be thicker than electrically insulating layer 40. In other cases, it is desirable for first and second electrically conductive layers 32, 36 to each or singularly be thinner than electrically insulating layer 40. In some cases, the thickness of first electrically conductive layer 32 is approximately the same as that of second electrically conductive layer 36. In other cases, the thickness of first electrically conductive layer 32 is different than that of second electrically conductive layer 36. In some cases, the thickness of second electrically conductive layer 36 is greater than that of first electrically conductive layer 32, such that second conductive layer 36 functions to more effectively spread heat laterally from the location of an LED die 20, while permitting fine circuit features on first electrically conductive layer 32.

Second electrically conductive layer 36 of substrate 30 is disposed adjacent a heat sink or heat dissipation assembly 50, and is thermally coupled thereto by a layer 52 of thermal interface material. Heat dissipation assembly 50 can be, for example, a heat dissipation device, commonly called a heat sink, made of a thermally conductive metal such as aluminum or copper, or a thermally conductive electrically insulating material such as a carbon-filled polymer or combinations thereof. Layer 52 of thermal interface material may comprise any suitable material, including adhesives, greases, and solder. The thermal interface material of layer 52 may be, for example, a thermally conductive, electrically insulating adhesive such as a boron nitride loaded polymer (e.g., 3M™ Thermally Conductive Adhesive TC-2810 sold by 3M Company), or a thermally conductive, electrically conductive material such as a silver filled compound (e.g., Arctic Silver™ 5 High-Density Polysynthetic Silver Thermal Compound sold by Arctic Silver Incorporated of Visalia, Calif., U.S.A.). Preferably, heat dissipation assembly 50 has a thermal impedance as small as possible, preferably less than 1.0° C./W. In some cases, heat dissipation assembly 50 preferably has a thermal impedance in the range of 0.5 to 4.0° C./W. The material of layer 52 desirably has a thermal conductivity in the range of 0.1 to 100 W/m-° C., preferably at least 1 W/m-° C.

In one embodiment, second electrically conductive layer 36 and thermal interface material of layer 52 are eliminated, such that electrically insulating layer 40 is in direct contact with heat dissipation assembly 50.

Figure 2:
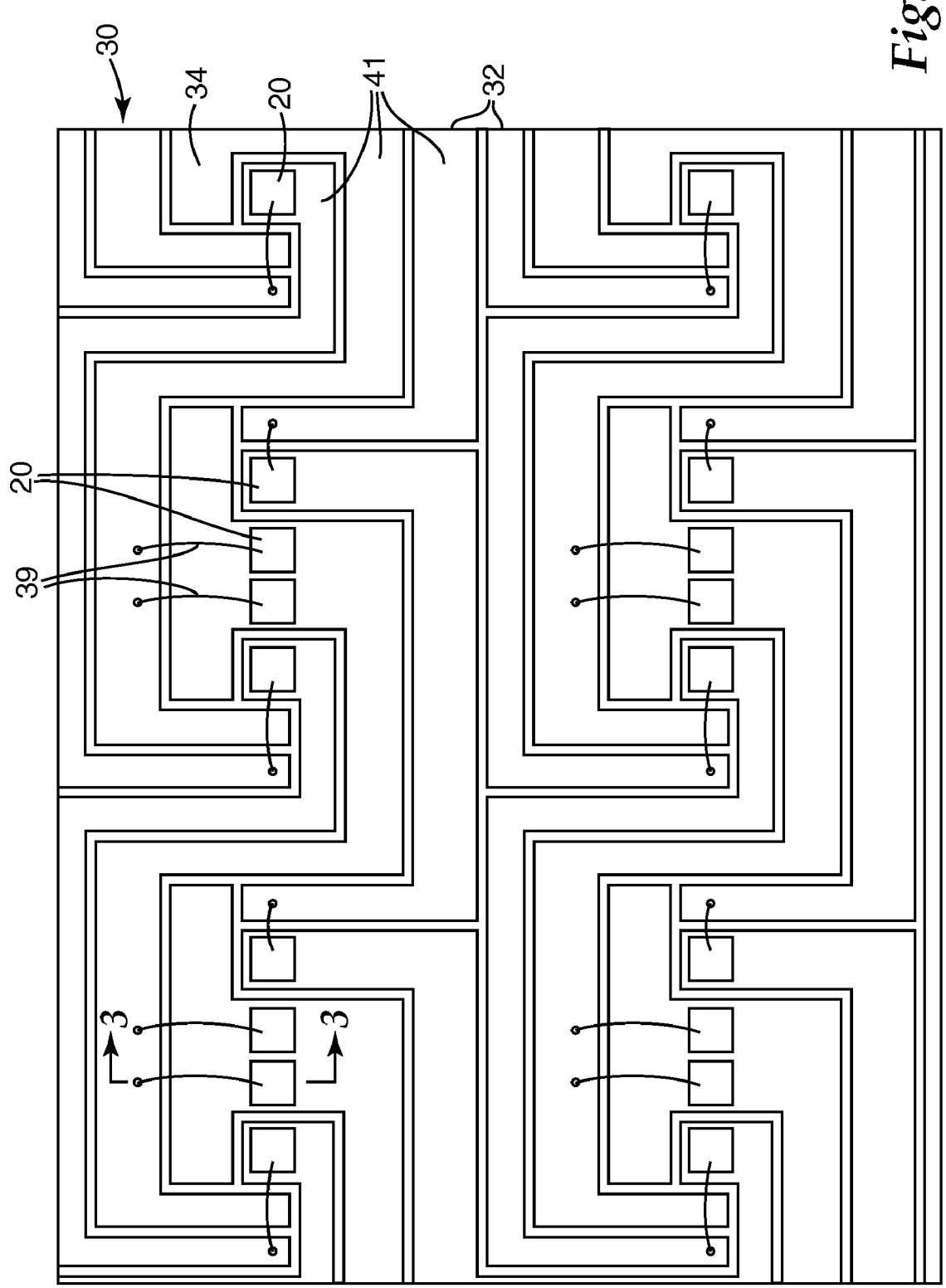
FIG. 2 is a top plan view of a portion of the illumination assembly of FIG. 1, showing a larger surface area of the illumination assembly.

The pattern of first conductive layer 32 of FIG. 1 is best seen in FIG. 2. As described above, first conductive layer 32 is patterned to define a plurality of circuit traces 41. Each circuit trace 41 is positioned for electrical and thermal coupling to an associated LED die 20 and also to an associated wirebond 39, such that at least some LED dies 20 are electrically connected in series, in parallel or combinations thereof as shown in FIG. 2, based on requirements of the particular application. As best seen in FIG. 2, instead of patterning first conductive layer 32 to provide only narrow conductive wiring traces to electrically connect the LED dies 20, first conductive layer 32 can be patterned to remove only as much conductive material as is necessary to electrically isolate circuit traces 41, leaving as much of first conductive layer 32 as possible to act as a reflector for the light emitted by LED dies 20. Leaving as much of first conductive layer 32 as possible also results in wider circuit traces 41 and allows high electrical drive currents needed by high power devices such as LEDs. The wide circuit traces also help spread the LED heat source laterally on layer 32. In some embodiments, second electrically conductive layer 36 may be also be patterned for additional circuit complexity, particularly when using an electrically insulating thermal interface material layer 52.

Portions of substrate 30 may be patterned to receive a single LED die, die clusters or banks or rows of LED dies. LED dies may include complementary color diodes, or different white color temperatures. In some embodiments, more than one LED (e.g., LEDs having respective red, green and blue color outputs) are closely positioned in a localized area to generate apparent white light. The positioning of the LED dies, or the positioning of the LED dies in combination with an optional encapsulant and/or an optical film can be configured to enhance color mixing.

Figure 3:
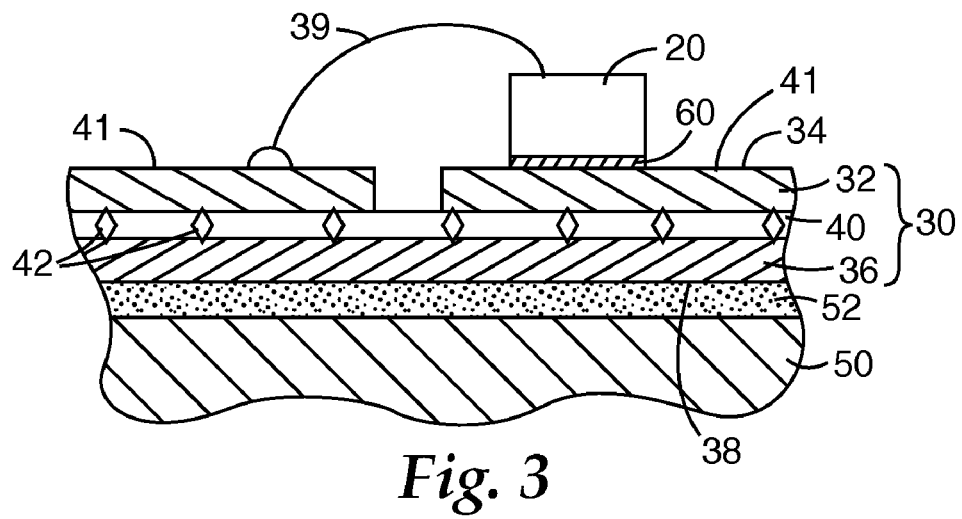
FIG. 3 is an enlarged cross-sectional illustration taken along line 3-3 of FIG. 2, showing uniformly distributed thermally conductive particles.

FIG. 3 is an enlarged sectional view taken along line 3-3 of FIG. 2. LED die 20 is positioned on top surface 34 of first conductive layer 32 and electrically connected to circuit trace 41 of first conductive layer 32 by wirebond 39, and also with a layer 60 of either isotropically conductive adhesive (for example, Metech 6144S, available from Metech Incorporated of Elverson, Pa., U.S.A.,), or an anisotropically conductive adhesive, or solder. Solders typically have a lower thermal resistance than adhesives, but not all LED dies have solderable base metallization. Solder attachment can also have the advantage of LED die 20 self-alignment, due to the surface tension of the molten solder during processing. Some LED dies 20 may be supplied with a high temperature 80/20 gold/tin solder which can be reflowed to form a very stable, low thermal resistance interface capable of withstanding subsequent soldering processes up to 260° C. However, some LED dies 20 may be sensitive to solder reflow temperatures, making an adhesive preferable in layer 60.

Figure 4:
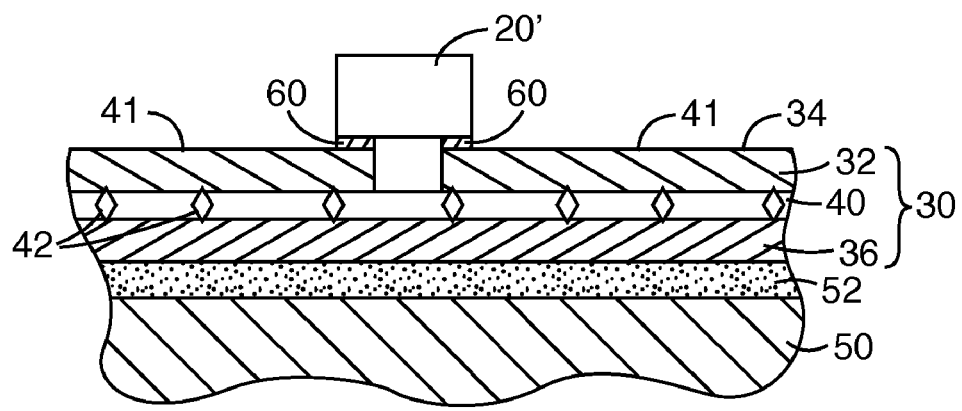
FIG. 4 is an enlarged cross-sectional illustration showing another illumination assembly having uniformly distributed thermally conductive particles.

Referring now to FIG. 4, a cross-sectional illustration of another illumination assembly shows an LED die 20' having both electrical contact pads on the same side of the LED die, rather than on opposite sides of the diode as in the wirebonded embodiments of FIGS. 1-3. Depending upon the design of LED die 20', light is emitted from the side of the diode 20' that is opposite the contact pads, or from the side of diode 20' that is on the same side as the contact pads. As with the wirebond LED dies 20 of FIGS. 1-3, electrically conductive adhesives, anisotropically conductive adhesives, or solder re-flow are among the attachment methods that can be used to attach LED die 20' to first conductive layer 32.

As illustrated in FIGS. 3 and 4, electrically insulating layer 40 of substrate 30 comprises an electrically insulating polymer adhesive material loaded with electrically insulating, thermally conductive particles 42 that enhance the thermal conductivity of insulating layer 40. At least a portion of thermally conductive particles 42 are of a size large enough to simultaneously contact both first and second electrically conductive layers 32, 36. Large thermally conductive particles 42 (i.e., particles of the same or larger size than the thickness of insulating layer 40) provide higher thermal conductivity than highly loaded small thermally conductive particles (i.e., particles of smaller size than the thickness of insulating layer 40), because large thermally conductive particles 42 provide a direct thermal path through insulating layer 40 without intervening dielectric materials of insulating layer 40 adversely affecting the thermal conductivity. Thus, the thermal impedance between first and second electrically conductive layers 32, 36 is limited only by the thermal conductivity of thermally conductive particles 42 and the horizontal loading of thermally conductive particles 42 within insulating layer 40. The polymer material of insulating layer 40 provides adhesion between first and second electrically conductive layers 32, 36 and thermally conductive particles 42.

In addition to large thermally conductive particles that simultaneously contact both the first and second electrically conductive layers 32, 36, insulating layer 40 can also include other particles that do not simultaneously contact both the first and second electrically conductive layers 32, 36, e.g., that are smaller than the thickness of insulating layer 40. In some embodiments, these other particles further enhance the thermal conductivity of insulating layer 40. In some embodiments, these other particles enhance other properties (whether electrical, optical, and/or mechanical) of the insulative layer 40. In one embodiment, the other particles that do not simultaneously contact both the first and second electrically conductive layers 32, 36 have a dielectric constant of at least 100.

In one embodiment, all or a portion of the large particles 42 (e.g., particles that simultaneously contact both the first and second electrically conductive layers 32, 36) consist of a material with a dielectric constant of at least 10. These large, high permittivity particles in contact with the electrically conductive layers 32, 36 can increase the effective dielectric constant and hence the capacitance of the insulating layer 40. As in the thermal case, small dielectric and/or thermally conductive particles (e.g., particles that do not simultaneously contact both the first and second electrically conductive layers 32, 36) can be intermixed with the large particles to provide further enhancement of the thermal conductivity and/or relative dielectric constant of the material.

Figure 5A:
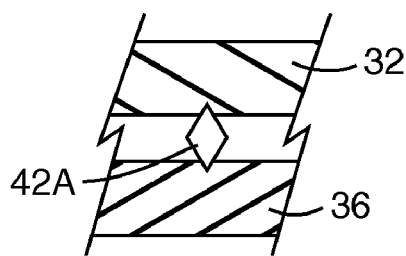
FIGS. 5A-5C are greatly enlarged cross-sectional illustrations of embedded and deformed thermally conductive particles.
Figure 5B:
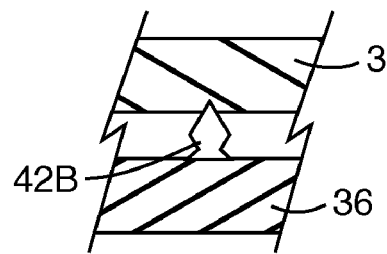
Figure 5C:
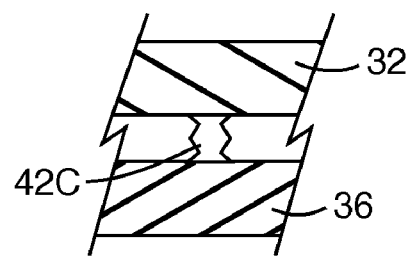

In FIGS. 3 and 4, the thermally conductive particles 42 are illustrated as extending partially into, or deforming, both the first and second electrically conductive layers 32, 36. Depending upon the relative hardness of particles 42, first conductive layer 32 and second conductive layer 36, particles 42 either deform or are deformed by first and second electrically conductive layers 32, 36. Referring to FIGS. 5A-5C, particle 42A is shown deforming both conductive layers 32, 36 (FIG. 5A); particle 42B is shown deforming one conductive layer (i.e., conductive layer 32) and deformed by the other conductive layer (i.e., conductive layer 36) (FIG. 5B); and particle 42C is shown deformed by both conductive layers 32, 36 (FIG. 5C).

In FIGS. 3 and 4, thermally conductive particles 42 are uniformly distributed throughout insulating layer 40. Uniformly distributing thermally conductive particles 42 having a size larger than the final thickness of insulating layer 40 can be achieved by, for example, depositing particles on a previously formed layer 40 or by using a solvent coating process. Particles 42 can be coated onto a layer 40, previously formed by either solvent or solventless coating processes, by spraying, sifting or otherwise depositing particles to form a globally uniform, though locally random density of particles on the layer 40. Particles 42 can also be combined with the resin matrix prior to coating. For example, a wet layer of resin loaded with thermally conductive particles 42 can be coated on one or both of first and second electrically conductive layers 32, 36, the wet layer having an initial thickness that may be larger than the size of thermally conductive particles 42. Drying the wet resin shrinks the thickness of the material and results in a final adhesive thickness that is thinner than thermally conductive particles 42. Typically, the thickness of the electrically insulating layer 40 ranges from about 0.5 to about 50 µm.

Suitable resins include epoxies and blends thereof. Commercially available epoxies include Epon™ 1001F epoxy resin sold by Resolution Performance Products and XP71756 epoxy sold by Vantico Inc. Exemplary resins can withstand temperatures that would be encountered in a typical solder reflow operation, for example, in the range of about 180° to about 290° C. Preferably, the resin can withstand short term exposure to temperatures over 300° C. needed to reflow 80/20 gold/tin solder commonly used for LED die attachment. These resins may be dried or cured to form the electrically insulating layer 40.

Figure 6:
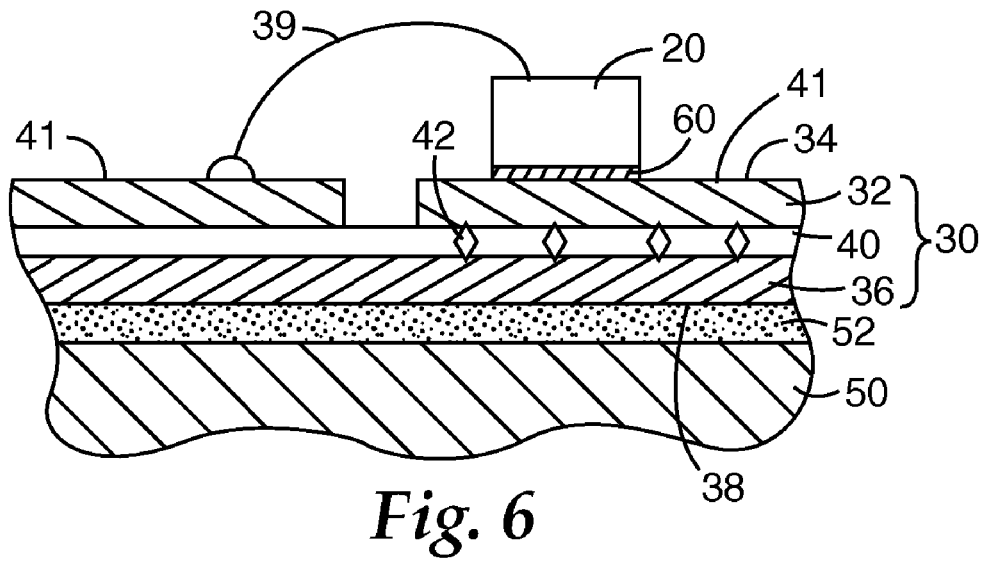
FIG. 6 is an enlarged cross-sectional illustration similar to FIG. 3, but showing non-uniformly distributed thermally conductive particles.

In other embodiments, as illustrated in FIG. 6, thermally conductive particles 42 are non-uniformly distributed throughout insulating layer 40 in specific patterns. In one embodiment, thermally conductive particles 42 are patterned so as to be more concentrated or present only in the regions to which high power devices requiring good thermal dissipation, such as LED dies 20, integrated circuit chips, etc., are to be attached. In FIG. 6, thermally conductive particles 42 are clustered near LED die 20. Patterning of thermally conductive particles 42 can be achieved by dispensing thermally conductive particles 42 separately from the coating of the polymer adhesive material of insulating layer 40. Separating the placement of thermally conductive particles 42 from the adhesive coating process is possible because high loadings of particles are not required to achieve low thermal impedance due to the direct contact of the large thermally conductive particles 42 with both first and second electrically conductive layers 32, 36. The thermal impedance of the insulating layer 40 is a function of the particle 42 loading, the degree to which particles 42 deform and/or are deformed by conductive layers 32, 36, and also the type and crystallography of the particles 42 themselves.

For example, the thermally conductive particles 42 can be patterned onto a previously coated adhesive layer using at least one mask (e.g., a stencil, template, cellular type material, mesh, etc.) having openings therein and sifting or otherwise dispersing the thermally conductive particles 42 through openings in the mask onto a carrier or substrate capable of supporting or carrying temporarily and/or permanently at least some of the particles. The assembly of the mask and the carrier receives a quantity of the particles, some of which go through the openings of the mask and are fixed to or rest on the carrier and another portion of which go onto the mask and rest on the mask between the openings. The outer surface of the mask (opposite the surface adjacent the carrier) is preferably provided with affixing means to which the particles will adhere to hold the particles on the outer surface of the mask. Then, the mask having the particles adhered thereto is separated from the carrier, the separated mask thereby effectively and efficiently removing the plurality of particles that will not form a part of the final product. The result is a distributed pattern of particles on the carrier. The particles are distributed on the carrier according to the design of the mask primarily according to the size, shape and distribution of the openings of the mask as well as by the size and shape of the particles. Thus a programmed or non-random distribution of the particles is provided on the carrier.

The support or temporary retention of the particles on the carrier can be provided by the characteristics of the carrier and/or the particles as well as the surface characteristics of the carrier or particles, such as coating materials applied to the carrier and/or particles, moisture content, humidity, weight, (utilization of gravity temperature) temperature (e.g., negative temperature), magnetization, static electricity, discharge conditions, etc. In addition, after placing of the particles on the carrier, further substances can be applied to more permanently affix the particles to the carrier. The mask can be removed from the carrier before, during, or after such fixing of the particles to the carrier. After placing the particles on the carrier and removal of the mask, this assembly is subjected to further processing. As a result of this further processing, the particles 42 are loaded into insulating layer 40. In one embodiment, the carrier is at least one of conductive layers 32, 36 having an adhesive resin coated thereon. The use of a mask and carrier for distributing abrasive particles as described in U.S. Pat. No. 6,478,831 (Tselesin) is illustrative.

Particles 42 may be preferentially oriented such that a majority of the particles 42 protrude from the adhesive resin of insulating layer 40, using electrostatic or magnetic coating techniques known in the art of applying particles to backings. During electrostatic coating, electrostatic charges are applied to the particles and this propels the particles toward the binder precursor-coated article. Magnetic coating involves using magnetic fields to force abrasive particles toward and into the binder precursor.

As described above, particles 42 are selected to enhance the thermal conductivity of the insulating layer 40. Any suitable materials can be chosen for this purpose. In exemplary embodiments, the particles 42 are composed of silicon carbide, aluminum oxide, boron nitride, diamond, or more complex, engineered materials such as metallic particles with electrically insulating coatings or nanoparticles. Particles 42 are dielectric (electrically insulating) to prevent electrical shorting between conductive layers 32, 36. However, in some embodiments, electrical connection between conductive layers 32, 36 may be desired at specific locations, and large electrically conductive particles can be included in layer 40 at those locations.

Exemplary relatively high dielectric particles include barium titanate, barium strontium titanate, titanium oxide, lead zirconium titanate, boron, boron nitride, diamond, alumina, beryllium, silicon, as well as other carbides, oxides, and nitrides of those materials, and compounds or mixtures thereof. A commercially available barium titanate is available from Nippon Chemical Industrial Co., Tokyo, Japan, under the trade designation "BESPA AKBT."

Exemplary electrically conductive particles may comprise electrically conductive or semiconductive materials such as carbon, graphite, metal or metal alloy particles, where the metal may be silver, gold, nickel, copper tin, or metal coated polymeric particles or metal coated shaped polymeric particles.

Thermally conductive particles 42 may be any shape and may be regularly or irregularly shaped. Exemplary shapes include spheres, platelets, cubes, needles, oblate, spheroids, pyramids, prisms, flakes, rods, plates, fibers, chips, whiskers, and combinations thereof. The particle size, i.e., the smallest dimension of the particle, typically ranges from about 0.05 to about 50 μm. Particles can be substantially the same size, or mixtures of different sizes of particles can be used. The shape and size of thermally conductive particles 42 are selected to ensure at least a portion of particles 42 simultaneously contact both first and second electrically conductive layers 32, 36. At least a portion of the particles 42 have a size sufficient to simultaneously contact both the first and second electrically conductive layers 32, 36. In some embodiments, the average size of the particles 42 can be greater than the thickness of the electrically insulating layer 40. In some embodiments, substantially every particle 42 has a size greater than the thickness of the electrically insulating layer 40.

The loading of particles 42 in the polymer is typically 10% to 75% by volume, based on the total volume of the electrically insulating layer 40. As discussed above, distribution of particles 42 may be uniform or patterned. High loading of particles 42 in the polymer may be may cause a decrease in adhesion between the polymer and electrically conductive layers 32, 36. However, techniques for improving adhesion as are known in the art may be employed. For example, surfaces of the first and second electrically conductive layers 32, 36 that adjoin insulating layer 40 can be treated to provide improved adhesion with the insulating layer 40. Exemplary surface treatments that are useful in providing improved adhesion include 5-aminobenzotriazole and 3-glycidoxypropyltrimethoxysilane, corona discharge, plasma ashing/etching, self-assembled monolayers, and reactive layers to bind the resin matrix material to the first and second electrically conductive layers 32, 36. Metal layers can also be treated with anti-corrosion treatments to improve adhesion (e.g., the use of zinc/chromium treatments for copper). In another technique for improving adhesion, particle-free resin matching the particle-containing resin may be skin-coated onto one or both conductive layers 32, 36 and partially cured. The partially cured particle-free resin is then brought into contact with the particle-containing resin and fully cured. Of course, particles 42 can also be surface treated in an analogous manner, to improve adhesion to the polymer.

In addition to altering the thermal properties of insulating layer 40, the polymer material and/or particles 42 can also be selected to alter the electrical, optical and/or mechanical properties of the insulating layer 40. When the electrical design includes large areas of exposed electrically insulating layer 40 near the LEDs, the optical properties (e.g., reflectivity, diffusivity, transparency) of the electrically insulating layer 40 can also be enhanced.

The polymer material and/or particles 42 can be selected to enhance the reflectivity of the insulating layer 40. For example, insulating layer 40 can be loaded with white, diffusely reflective materials e.g., $BaSO_4$, $TiO_2$, or with high refractive index materials, e.g., diamond, SiC, $Al_2O_3$, or with reflective materials, e.g., silver flakes or nanoparticle materials or materials oriented with electrical/magnetic means for desired optical properties such as ferroelectrics, e.g., PLZT. Alternatively, the polymer material and/or particles 42 can be selected to cause the insulating layer 40 to be substantially transparent. In this case the optical properties of the coated side of the second electrically conductive layer 36 may be selected or altered to provide desired characteristics (e.g., reflectivity, diffusivity). In other embodiments, the polymer material and/or particles 42 are selected to cause the insulating layer 40 to have a desired apparent color.

In each of these embodiments, an encapsulant may be provided on each LED die 20 to help couple light out of the die, and/or to preferentially direct the emitted light towards the insulating layer 40 to be reflected (whether specularly or diffusely), polarized, or waveguided by the insulating layer 40. The macro, micro and nanostructure of the insulating layer 40 can be engineered for specific optical properties by pre-forming the inner major surfaces of conductive layers 32, 36 (i.e., the interface of electrically insulating layer 40 with first electrically conductive layer 32 and with second electrically conductive layer 36. For example the inner surface of a copper foil can be structured by chemical (grain etching), mechanical (embossing), or optical (laser ablation) means. This structure is impressed onto the insulating layer 40, the surface of which takes on an inverse or mirror image of the metal film pre-form. The optical properties of the insulating layer 40 can also be modified by the addition of one or more phosphor or fluorescent materials into the insulating layer 40 so that a shift in the wavelength of the incident radiation occurs. Efficient removal of the Stokes shift energy in these cases of wavelength conversion is an additional benefit.

Figure 7:
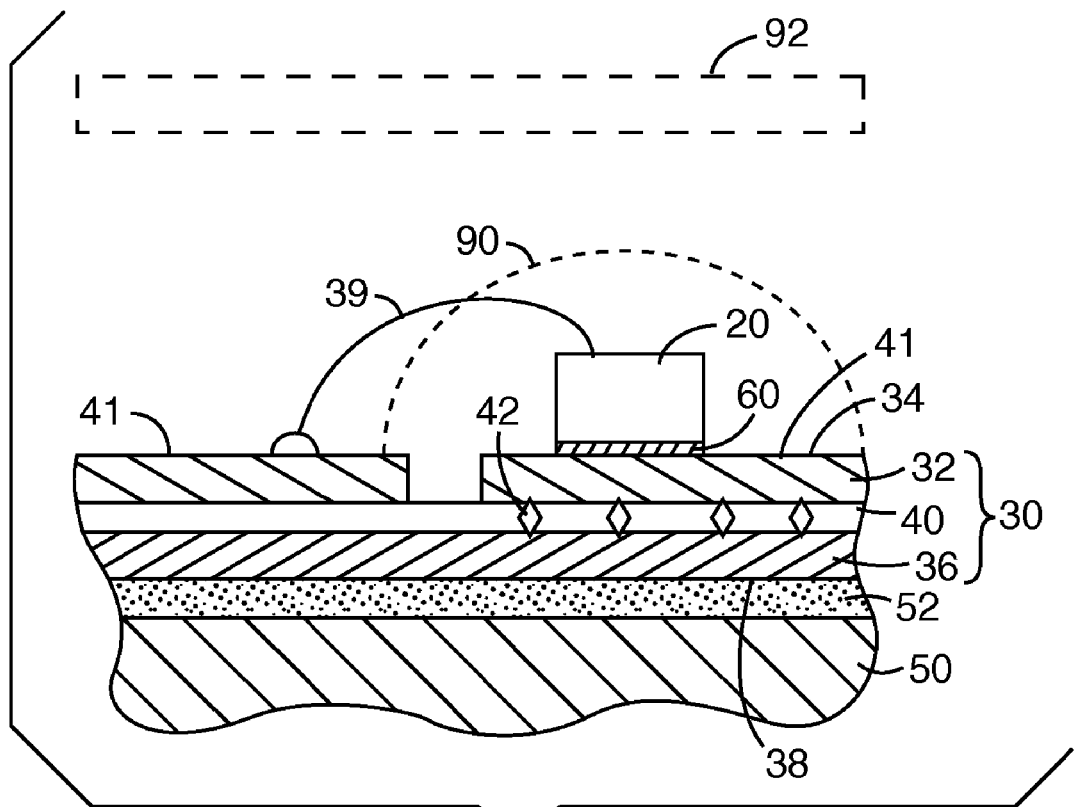
FIG. 7 is an enlarged cross-sectional illustration similar to FIG. 6, showing optional use with an encapsulant and optical film.

The exemplary embodiments described herein are particularly useful when used in combination with known encapsulants and/or known optical films. For example, encapsulants having a phosphor layer (for color conversion) or otherwise containing a phosphor can be used on or around the LED die 20 without degrading the LED die light output. FIG. 7 shows a portion of an illumination assembly similar to that of FIG. 6, but wherein an optional encapsulant 90 covers the LED die 20, and one or more optional optical film(s) 92, such as a diffusing film, a polarizing film (such as any of the Vikuiti™ DBEF films available from 3M Company), or a structured surface film (such as any of the Vikuiti™ BEF films available from 3M Company), are used in combination with the assembly. If desired, a single encapsulant can encapsulate multiple LED dies, whether of the same or different emitted colors.

Figure 8:
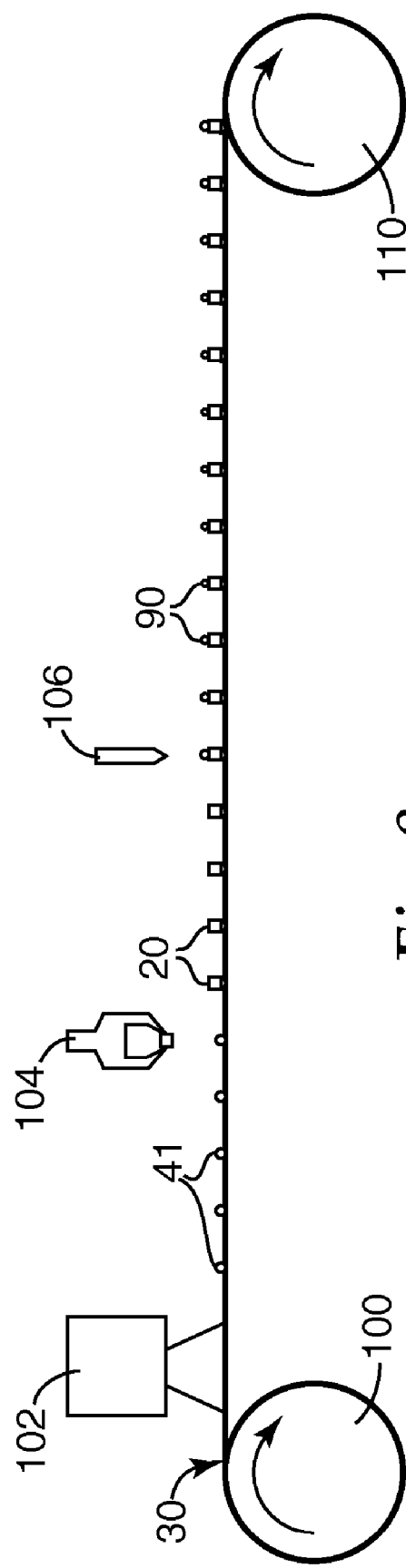
FIG. 8 is a schematic illustration of one method of making an illumination assembly.

Referring now to FIG. 8, in making an illumination assembly 10, the substrate 30 as described above is provided, such as by unwinding a supply roll 100 of the substrate, and the first electrically conductive layer 32 is patterned at patterning station 102 to form the desired circuit traces 41. Patterning of layer 32 may be accomplished using any traditional circuit construction technique. LED dies 20 are attached to the patterned first electrically conductive layer 32 at die attach station 104 using known and conventional die attach and wire bonding methods as described above. Next, encapsulant 90 is optionally applied at encapsulation station 106 and thereafter cured before the substrate 30 with LED dies 20 thereon is wound onto take-up roll 110. In some cases, rather than being processed in a roll-to-roll manner, substrate 30 is panelized and batch processed on a rigid or semi-rigid carrier. In some cases, instead of being wound onto take-up roll 110, the substrate 30 having LED dies 20 thereon is cut at intervals to provide a plurality of illumination assembly strips, panels, or other shapes suitable for mounting in a backlight, for use e.g., in backlit displays, signs, or graphics. In still other cases, the take-up roll 110 can become a supply roll for subsequent processing steps.

Referring now to FIGS. 9A-9D, an exemplary method for making the substrate 30 as described above is illustrated. The second conductive layer 36 is provided, such as by unwinding a supply roll 120 of the conductive layer 36, and at an adhesive coating station 122, a layer 124 of electrically insulative adhesive is applied to the conductive layer 36. Adhesive layer 124 is optionally loaded with dielectric particles (not shown). At a thermal particle application station 126, thermally conductive particles 42 are applied on the adhesive layer 124. In one embodiment, thermally conductive particles 42 are uniformly applied on the adhesive layer 124. In another embodiment, thermally conductive particles 42 are applied on the adhesive layer in a predetermined pattern. In one embodiment, particles 42 are applied in a wet resin using solvent coating methods as are known in the art, such that upon drying of the resin, particles 42 project above the surface of the dried resin layer 128. At a laminating station 130, first conductive layer 32 (optionally having a layer 124' of electrically insulative adhesive, which may also include particles 42) provided from supply roll 134 and pressed against second conductive layer 36 and particles 42 thereon, such that particles 42 are forced through adhesive layers 124, 124' and partially deform and/or are deformed by electrically conductive layers 32, 36 to form substrate 30. The substrate 30 is then wound onto take-up roll 140. Take-up roll 140 can become supply roll 100 for subsequent processing steps as described with respect to FIG. 8. In some cases, instead of being wound onto take-up roll 140, processing of substrate 30 proceeds directly to the processing steps as described with respect to FIG. 8.

EXAMPLE 1

A substrate was made using diamond particles dispersed in a binder. The dispersion was 92% by weight diamond, and included a mixture of diamond particle sizes. The average of the particle size distributions were 0.25, 3 and 30 micron, and the weight ratio of each particle size was 1:2:4. Within these particle size distributions, the maximum particle size, as measured by the vendor, was up to 47 microns. The adhesive binder was a thermoset epoxy available under the trade designation Heloxy 71 from Resolution Performance Products. Before coating, the 100% solids mixture was diluted with methyl isobutyl ketone. Using a knife coater with a 100 micron gap, as rolled 1 oz. copper foil was coated with the diamond loaded adhesive and air dried for four hours at room temperature. After air drying, a 24 inch nip roller at 140° C. and 40 pounds loading was used to laminate the coated copper foil to an identical, uncoated foil. When the coating was laminated, there was some flow of the diamond loaded adhesive, which resulted in a lower coating thickness. The laminate was then cured for 3 hours at 160° C. The maximum particle size, which, together with the lamination pressure, determined the final dielectric thickness, was up to 47 microns. The resulting substrate had a 40 micron thick dielectric layer. The diamond particles appeared to deform both layers of copper. The 40 micron dielectric thickness in the sample had a thermal impedance of approximately 1 cm$^{2\circ}$ C./W as measured at 3M using custom thermal impedance measurement equipment. Notably, the thermal impedance of the 40 micron thick sample was approximately the same as the thermal impedance of an 8 micron C-ply sample (available from 3M Company under the trade designation 3M™ Embedded Capacitor Material), despite the five-fold difference in thickness.

EXAMPLE 2

A diamond epoxy coating as described in Example 1 was laminated and cured using a vacuum press at 24 inches of vacuum and 180° C. for 2 hours. The resulting dielectric thickness of the sample made by this method was 30 microns; thinner than the sample prepared by hot roll lamination in Example 1.

The disclosed substrate can be used not only with LED dies as discussed above, but with other circuit components, particularly other types of miniature light sources or other components that generate substantial heat. Thus, we contemplate assemblies similar to the foregoing disclosed illumination assemblies but wherein some or all of the LED dies are replaced by one or more of: laser diodes, organic light emitting diodes (OLEDs), power transistors, integrated circuits (ICs), and organic electronics.

Unless otherwise indicated, all numbers expressing quantities, measurement of properties and so forth used in the specification and claims are to be understood as being modified in all instances by the term "about." Accordingly, unless indicated to the contrary, the numerical parameters set forth in the specification and claims are approximations that can vary depending upon the desired properties sought to be obtained by those skilled in the art utilizing the teachings of the present invention. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviations found in their respective testing measurements.

The foregoing description is illustrative and is not intended to limit the scope of the invention. Variations and modifications of the embodiments disclosed herein are possible, and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

The invention claimed is:

1. An illumination assembly, comprising:
a substrate comprising a first and second electrically conductive layer separated by an electrically insulating layer, the insulating layer comprising a polymer material loaded with thermally conductive particles, wherein at least a portion of the thermally conductive particles simultaneously contact both the first and second electrically conductive layers and extend partially into at least one of the first and second electrically conductive layers, wherein the thermally conductive particles are not deformed and at least one of the first and second electrically conductive layers are deformed by the thermally conductive particles sufficiently to eliminate an interface of the polymer material between the thermally conductive particles and the at least one of the first and second electrically conductive layers into which the portion of the thermally conductive particles extend, and wherein the thermally conductive particles penetrate the at least one of the first and second electrically conductive layers beyond the eliminated interface; and
a plurality of light sources disposed on the first conductive layer.

2. The assembly of claim 1, wherein the light sources are selected from the group of LEDs, laser diodes, and OLEDs.

3. The assembly of claim 1, wherein the thermally conductive particles comprise particles selected from the group of barium titanate, barium strontium titanate, titanium oxide, lead zirconium titanate, boron, boron nitride, diamond, alumina, beryllium, silicon, and any carbides, oxides, and nitrides thereof.

4. The assembly of claim 1, further comprising dielectric particles having a dielectric constant of at least 100 loaded in the polymer material of the insulating layer, wherein the dielectric particles do not simultaneously contact both the first and second electrically conductive layers.

5. The assembly of claim 1, wherein the thermally conductive particles are non-uniformly distributed in the insulating layer.

6. The assembly of claim 4, wherein the thermally conductive particles are concentrated near the light sources.

7. The assembly of claim 1, wherein at least one of the first and second electrically conductive layers comprises a foil.

8. The assembly of claim 1, wherein the first electrically conductive layer is patterned to form one or more traces.

9. The illumination assembly of claim 1, wherein the second electrically conductive layer comprises a heat sink.

10. The assembly of claim 1 in combination with:
a heat sink; and
a layer of thermal interface material disposed between the heat sink and the second conductive layer.

11. A backlight for a display, comprising the assembly of claim 1.

12. A method of making an illumination assembly, the method comprising:
supplying a substrate comprising a first and second electrically conductive layer separated by an electrically insulating layer, the insulating layer comprising thermally conductive particles, wherein at least a portion of the thermally conductive particles simultaneously contact both the first and second electrically conductive layers and extend partially into at least one of the first and second electrically conductive layers, wherein the thermally conductive particles are not deformed and at least one of the first and second electrically conductive layers are deformed by the thermally conductive particles sufficiently to eliminate an interface of the polymer material between the thermally conductive particles and the at least one of the first and second electrically conductive layers into which the portion of the thermally conductive particles extend, and wherein the thermally conductive particles penetrate the at least one of the first and second electrically conductive layers beyond the eliminated interface;
patterning the first electrically conductive layer; and
providing a plurality of light sources on the patterned first electrically conductive layer.

13. The method of claim 12, wherein the supplying step comprises:
applying a layer of electrically insulative polymer material on the second electrically conductive layer;
applying the thermally conductive particles on the layer of polymer material; and
laminating the first electrically conductive layer over the thermally conductive particles to force the thermally conductive particles into simultaneous contact with both the first and second electrically conductive layers.

14. The method of claim 13, wherein applying a layer of electrically insulative polymer material comprises loading the polymer material additionally with particles that are smaller than a thickness of the layer of electrically insulative polymer material, the particles having a dielectric constant of at least 100.

15. The method of claim 13, wherein applying the thermally conductive particles comprises applying the thermally conductive particles in a pattern.

16. The method of claim 12, wherein the supplying step comprises:
applying a layer of electrically insulative polymer material having the thermally conductive particles dispersed therein on at least one of the first or second electrically conductive layer; and
laminating the first electrically conductive layer over the thermally conductive particles to force the thermally conductive particles into simultaneous contact with both the first and second electrically conductive layers.

17. The method of claim 12, wherein the supplying step comprises unwinding a roll of the substrate.

18. The method of claim 17, further comprising cutting the substrate at intervals to provide a plurality of illumination assembly strips, panels, or other shapes suitable for mounting in an illumination unit.

* * * * *